(12) United States Patent
Xiao et al.

(10) Patent No.: US 8,546,882 B2
(45) Date of Patent: Oct. 1, 2013

(54) TERMINAL STRUCTURE FOR SUPERJUNCTION DEVICE AND METHOD OF MANUFACTURING THE SAME

(75) Inventors: Shengan Xiao, Shanghai (CN); Fei Wang, Shanghai (CN); Yanping Liu, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 352 days.

(21) Appl. No.: 13/076,289

(22) Filed: Mar. 30, 2011

(65) Prior Publication Data
US 2011/0241110 A1  Oct. 6, 2011

(30) Foreign Application Priority Data
Apr. 6, 2010 (CN) .......................... 2010 1 0141072

(51) Int. Cl.
*H01L 21/331* (2006.01)
(52) U.S. Cl.
USPC ............ 257/339; 257/E21.409; 257/E29.255; 438/289

(58) Field of Classification Search
USPC ........... 257/339, E21.409, E29.255; 438/289
See application file for complete search history.

(56) References Cited

U.S. PATENT DOCUMENTS 6,576,506 B2   6/2003 Shibib
7,595,537 B2   9/2009 Kodama et al.

FOREIGN PATENT DOCUMENTS

CN   101217144 A   7/2008
CN   201163629 Y   12/2008

*Primary Examiner* — Marvin Payen
(74) *Attorney, Agent, or Firm* — Blakely Sokoloff Taylor & Zafman (57) ABSTRACT

A terminal structure for superjunction device is disclosed. The terminal structure comprises from inside out at least one P type implantation ring and several P type trench rings formed in an N type epitaxial layer to form alternating P type and N type regions. A channel cut-off ring is formed at the border of the device. The P type implantation ring is formed adjacent to the active area of the device and covers at least one trench ring. A terminal dielectric layer is formed to cover the P type implantation ring and the trench rings. A plurality of field plates are formed above the terminal dielectric layer. Methods of manufacturing terminal structure are also disclosed.

21 Claims, 9 Drawing Sheets

TERMINAL STRUCTURE FOR SUPERJUNCTION DEVICE AND METHOD OF MANUFACTURING THE SAME

CROSS-REFERENCES TO RELATED APPLICATIONS

This application claims the priority of Chinese patent application number 201010141072.X, filed on Apr. 6, 2010, the entire contents of which are incorporated herein by reference.

FIELD OF THE INVENTION

The present invention relates to a semiconductor device, more particularly, to a terminal structure of a superjunction semiconductor device, and a method of manufacturing the same.

BACKGROUND

By adopting a new voltage-withstanding structure consisting of a series of alternately arranged P-type and N-type semiconductor thin layers, a superjunction device has an advantage that both P-type and N-type regions can be fully depleted at a relative low voltage in an off-state, thereby exhibiting a high breakdown voltage even if the P-type and N-type doping regions have a much higher impurity concentration than a conventional device. Therefore, a superjunction MOSFET (metal oxide semiconductor field effect transistor) may simultaneously achieve a high breakdown voltage and a low on-resistance. Its device performance may surpass the performance limit of a conventional MOSFET.

A superjunction MOSFET is formed by a plurality of cells arranged in a repeated way in an active area. As the cells in a superjunction device have the same structure, no breakdown issue will arise between adjacent cells because the voltage between adjacent cells is zero in the horizontal direction. However, for a cell arranged at the border of the active area, a huge voltage difference may exist between such a cell and the substrate in the horizontal direction, which may lead to a breakdown. Generally, such a voltage difference is withstood by using a special structure called terminal structure, and therefore, a terminal structure is very important for a device with high breakdown voltage.

Currently, there are many terminal techniques designed for high voltage VDMOS, such as guarding ring technique, field plate technique (including floating field plate and resistance field plate), junction terminal extension, etc. However, the mechanism of lateral voltage withstanding in a superjunction device is quite different from the mechanism in a conventional VDMOS or a conventional diode. It is necessary to design new terminal structures for a superjunction device.

SUMMARY OF THE INVENTION

An objective of the present invention is to provide a terminal structure for superjunction device and a method of manufacturing the same to improve the voltage withstanding performance and the reliability of a superjunction device by using conventional semiconductor manufacturing processes.

To achieve the aforementioned objective, the present invention provides a terminal structure for superjunction device, wherein the superjunction device includes a first type substrate and a first type epitaxial layer formed on the first type substrate; the central part of the superjunction device is an active area; a plurality of trench stripes are formed in the first type epitaxial layer in the active area; a second type impurity is filled into the trench stripes to form second type trench stripes; the superjunction device further comprises a plurality of second type wells, formed beneath a surface of the first type epitaxial layer, each second type well surrounding a second type trench stripe; source regions, formed in each of the second type wells; a gate oxide layer, a gate electrode and a source electrode, respectively formed above the first type epitaxial layer; and a drain electrode, formed at a backside of the first type substrate. From a top view, the terminal structure is arranged around the periphery of the active area and the terminal structure comprises from inside out at least one second type implantation ring, a plurality of trench rings and a channel cut-off ring; from a cross section view, the second type implantation ring is formed beneath the surface of the first type epitaxial layer and covers at least one trench ring; each of the trench rings is formed in the first type epitaxial layer and is filled with a second type impurity; the channel cut-off ring is formed beneath the surface of the first type epitaxial layer near a border of the superjunction device; the terminal structure further comprises an inter layer dielectric film, formed above the first type epitaxial layer, covering a part of the second type implantation ring and the plurality of trench rings; and a plurality of field plates, including: an inside field plate, formed on the inter layer dielectric film; and at least one outside field plate, formed on or inside the inter layer dielectric film; the plurality of field plates are isolated from one another; wherein, the first type is N type when the second type is P type; the first type is P type when the second type is N type.

In a preferred embodiment, the width of the trench rings is smaller than or equal with the width of the trench stripes, and the spacing between adjacent trench rings is smaller than or equal with the spacing between adjacent trench stripes.

In a preferred embodiment, the trench rings have a shape of rectangular or a shape of rectangular with curved corners; additional trenches filled with a second type impurity are formed at the corners of each trench ring; the additional trenches can be connected to the corners of a trench ring or be isolated from the trench ring.

In a preferred embodiment, the second type implantation ring is connected to the second type wells in the active area.

In a preferred embodiment, the inside field plate is made of metal; the at least one outside field plate is made of metal when formed on the inter layer dielectric film, or is made of polysilicon when formed inside the inter layer dielectric film.

In a preferred embodiment, the inside field plate is interconnected to the gate electrode, or the inside field plate is connected to the second type wells or is floating.

In a preferred embodiment, a part of the inter layer dielectric film below the inside field plate is thicker than a part of the inter layer dielectric film below the at least one outside field plate; the part of the inter layer dielectric film below the inside field plate has a thickness of 5500-21500 angstroms, and the part of the inter layer dielectric film below the outside field plate has a thickness of 500-11500 angstroms; the part of the inter layer dielectric film below the inside field plate is formed from bottom up by a first dielectric film and a second dielectric film, or by the gate oxide layer and a second dielectric film, or by the gate oxide layer, a first dielectric film and a second dielectric film; while the part of the inter layer dielectric film below the at least one outside field plate is formed by a first dielectric film, or by the gate oxide layer, or formed from bottom up by the gate oxide layer and a first dielectric film.

In a preferred embodiment, the outside field plates are all floating or connected to the second type trench rings.

The present invention further provides a method of manufacturing terminal structure for superjunction device. The method comprises the following steps:

step 1: form a first type epitaxial layer on a first type substrate;

step 2: form a plurality of second type wells and at least one second type implantation ring in the first type epitaxial layer;

step 3: form trench stripes in an active area and form trench rings in a terminal area;

step 4: fill the trench stripes and the trench rings with a second type impurity;

step 5: form a gate oxide layer on the first type epitaxial layer and form polysilicon gates on the gate oxide layer in the active area;

step 6: form first type source regions and a channel cut-off ring by first type ion implantation;

step 7: form a plurality of field plates and isolating the plurality of field plates from the first type epitaxial layer by an inter layer dielectric film;

wherein, the first type is N type when the second type is P type; the first type is P type when the second type is N type Alternatively, step 2 can be performed after step 5.

Alternatively, the inter layer dielectric film is composed of a first dielectric film and a second dielectric film, and step 7 further comprises:

deposit the first dielectric film on the first type epitaxial layer and patterning the first dielectric film before step 5;

deposit and pattern the second dielectric film after step 6;

deposit metal and form the plurality of field plates by patterning the metal.

Alternatively, the inter layer dielectric film is composed of a first dielectric film and a second dielectric film, and step 7 further comprises:

deposit the first dielectric film on the first type epitaxial layer and pattern the first dielectric film before step 5;

form at least one outside field plate on the first dielectric film, wherein the at least one outside field plate is made of polysilicon and is formed simultaneously with the polysilicon gates during step 5;

deposit and pattern the second dielectric film;

deposit metal and form an inside field plate on the second dielectric film.

Alternatively, the inter layer dielectric film is composed of the gate oxide layer and a second dielectric film, and step 7 further comprises:

form at least one outside field plate on the gate oxide layer, wherein the at least one outside field plate is made of polysilicon and is formed simultaneously with the polysilicon gates during step 5;

deposit and pattern the second dielectric film;

deposit metal and form an inside field plate on the second dielectric film.

Alternatively, the inter layer dielectric film is composed of the gate oxide layer, a first dielectric film and a second dielectric film, and step 7 further comprises:

deposit the first dielectric film on the gate oxide layer and pattern the first dielectric film;

deposit and pattern the second dielectric film;

deposit metal and form the plurality of field plates by patterning the metal.

The method may further comprise:

form contact holes connecting to the first type source regions;

form ohmic contacts in the second type wells by a second type implantation through the contact holes;

form a source electrode and a gate electrode;

reduce the thickness of the first type substrate by backside grinding;

deposit metal on the backside of the first type substrate and form a drain electrode.

The present invention can improve the voltage withstanding performance and the reliability of a superjunction device without applying new complex processes to conventional semiconductor manufacturing processes.

BRIEF DESCRIPTION OF THE DRAWINGS

These and other features, aspects, and advantages of the present invention will become better understood with regard to the following description, appended claims, and accompanying drawings.

DETAILED DESCRIPTION OF THE INVENTION

The present invention is further detailed by embodiments in combination with the drawings by taking a 700V superjunction NMOSFET as an example. Those skilled in the art shall understand that the same structure and manufacturing method can also be applied to a PMOSFET by changing all the N-types to P-types and P-types to N-types.

In the following descriptions, the term "inside" is used to indicate a side close to the center of the device in the horizontal direction, while "outside" is used to indicate a side away from the center of the device in the horizontal direction.

Figure 1:
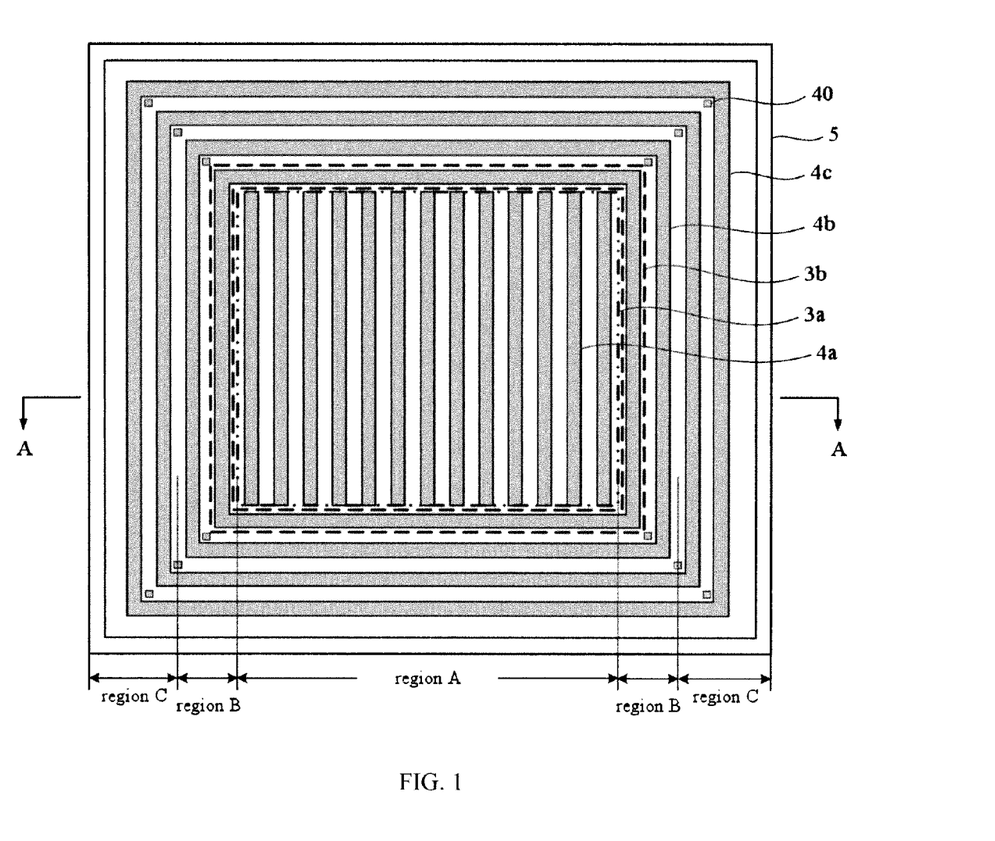
FIG. 1 is a top view of a terminal structure for superjunction device according to a first embodiment of the present invention.

FIG. 1 is a top view of a superjunction device having a terminal structure according to a first embodiment of the present invention. It should be mentioned that FIG. 1 is a top view taken from the top of the epitaxial layer 2, namely those elements above the epitaxial layer 2 are not shown in FIG. 1, although included in the superjunction device.

As shown in FIG. 1, the superjunction device is divided into three regions: region A, region B and region C, wherein region A is an active area with alternating P type and N type thin layers formed therein, enabling electric currents to flow in this region; region B and region C all belong to the terminal structure. When the device is in an on-state, regions B and C do not provide current paths, which means no electric current will flow through these two regions; when the device is in an off-state, regions B and C withstand the voltage between the border of region A and the border of region C (the border of the device). Regions B and C are all arranged around the periphery of the active area, namely region A, wherein region B is adjacent to region A, and region B contains at least one P type implantation ring 3b and at least one P type trench ring 4b. The P type implantation ring 3b covers at least one P type trench ring 4b. Region C contains at least one P type trench ring 4c and a channel cut-off ring 5. The P type trench rings 4b, 4c are of rectangular shapes. Additional trenches 40 are formed at the corners of each P type trench ring 4b or 4c to better balance the charge at the ring corner.

Figure 2:
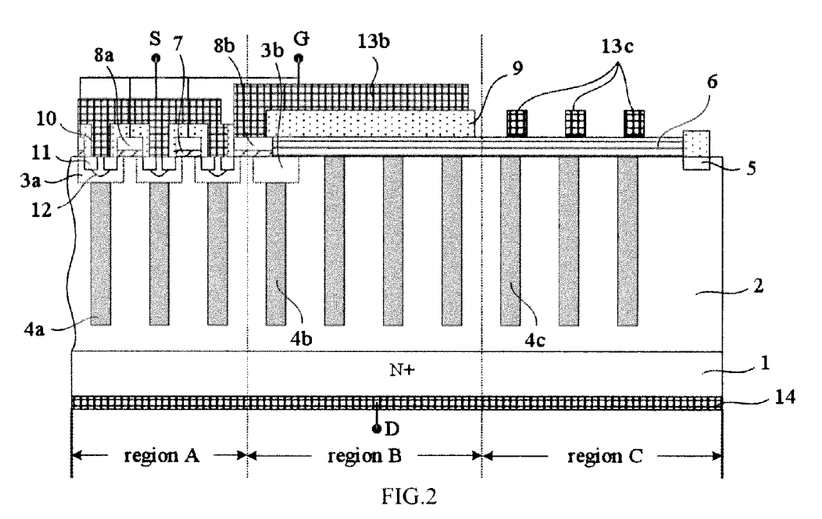
FIG. 2 is a cross section view of a terminal structure for superjunction device according to a first embodiment of the present invention.

FIG. 2 shows a sectional structure of the terminal structure for superjunction device according to the first embodiment. FIG. 2 is a cross section taken along line A-A of FIG. 1. An N type epitaxial layer 2 is formed on an N+ substrate 1, wherein the substrate 1 can be an N type substrate with high impurity concentration. A plurality of trenches are formed in the N type epitaxial layer 2, wherein the trenches include trench stripes 4a in the active area (region A), trench rings 4b, 4c in the terminal area (regions B and C) and additional trenches 40 (not shown in FIG. 2) at the corners of trench rings. All the trenches are filled with P type silicon, thereby forming P type trench stripes 4a in region A, P type trench rings 4b in region B, P type trench rings 4c in region C and P type additional trenches 40. The P type trench stripes 4a, the P type trench rings 4b, 4c and the N type epitaxial layer 2 form alternating P type and N type thin layers. Preferably, the width of the trench rings 4b, 4c is smaller than or equal with the width of the trench stripes 4a; the spacing between adjacent trench rings 4b, 4c is smaller than or equal with the spacing between adjacent trench stripes 4a. The additional trenches 40 can be connected to the corners of a trench ring 4b, 4c or be isolated from the trench ring.

P wells 3a are formed in region A beneath the surface of the N type epitaxial layer 2, namely in the upper part of the N type epitaxial layer 2. Each P well 3a covers a P type trench stripe 4a, or in other words, each P type trench stripe 4a is surrounded by a P well 3a. A P type implantation ring 3b is formed in region B beneath the surface of the N type epitaxial layer 2 and adjacent to region A, wherein the P type implantation ring 3b covers one or more trench rings 4b closest to region A. In the first embodiment, the P type implantation ring 3b covers only one trench ring 4b (the one neighboring to the trench stripe 4a at the outside border of region A), however, those skilled in the art shall understand that the P type implantation ring 3b could be laterally extended to cover more trench rings 4b in region B, or in other embodiments, more than one P type implantation rings 3b could be formed in region B to cover a same number of trench rings 4b. The P type implantation ring 3b closest to region A is generally connected to the P wells 3a in region A via interconnections such as metal lines.

In the active area, N+ source regions 11 are formed in each of the P wells 3a by ion implantation, and simultaneously, the channel cut-off ring 5 is formed by N+ ion implantation at the outside border of region C. In each of the P wells 3a, a P+ ohmic contact region 12 is formed by P+ ion implantation through contact holes 10 to achieve good ohmic contact between metal and P wells 3a and also improve the UIS (Unclamped Inductive Switching) performance of the device.

The device further comprises a gate oxide layer 7, polysilicon gates 8a, 8b, a source electrode S, a gate electrode G and a drain electrode D. The polysilicon gates 8a are formed in region A, while the polysilicon gate 8b is partly or totally located in region B. The source electrode S is connected to the N+ source regions 11. The gate electrode G is connected to the polysilicon gates 8a, 8b. The drain electrode D is formed at a backside of the N+ substrate 1.

When the superjunction device is in an on-state, electric currents flow vertically from the source electrode S, through the channels below the gate oxide layer 7, to the N drift regions (namely the N type epitaxial layer 2), and finally reach the backside metal layer 14 connecting to the drain electrode D. When the superjunction device is in an off-state, the alternating P type and N type thin layers in the active area, namely the P type trench stripes 4a and the N type epitaxial layer 2, will be depleted in the vertical direction to serve as voltage withstanding layers in region A, thereby the terminal structure can withstand the voltage between the active area and the border of the device.

The terminal structure further comprises a plurality of field plates, among which an inside field plate 13b is formed above the N type epitaxial layer 2 in region B, and at least one outside field plate 13c is formed above the N type epitaxial layer 2 in region C. The inside field plate 13b is formed by metal deposition and metal patterning. The inside field plate 13b is isolated from the N type epitaxial layer 2 by an inter layer dielectric film consisted of a first dielectric film 6 and a second dielectric film 9, wherein the first dielectric film 6 is formed by deposition and patterning of a specific field plate dielectric film, while the second dielectric film 9 is formed by deposition and patterning of a polysilicon-metal isolation dielectric film. One end of the inside field plate 13b is formed on and connected to the polysilicon gate 8b. The inside field plate 13b is connected to the gate electrode G of the device.

The outside field plates 13c are also metal field plates formed by metal deposition and metal patterning. The number of outside field plates 13c is preferably the same as the number of P type trench rings 4c in region C. In this embodiment, there are three outside field plates 13c formed above the N type epitaxial layer 2 in region C. The outside field plates 13c are isolated from each other and are isolated from the N type epitaxial layer 2 by the first dielectric film 6. The position of an outside field plate 13c overlaps with a part of a corresponding P type trench ring 4c and a part of the N type epitaxial layer 2.

One or more P type implantation rings may also be formed in region C. The channel cut-off ring 5 at the border of region C is formed by lithography and N+ ion implantation.

Region B and region C all belong to a terminal area. They do not provide current paths in an on-state of the device. They are used to withstand the voltage between the border of region A and the outside border of region C in an off-state.

Figure 3:
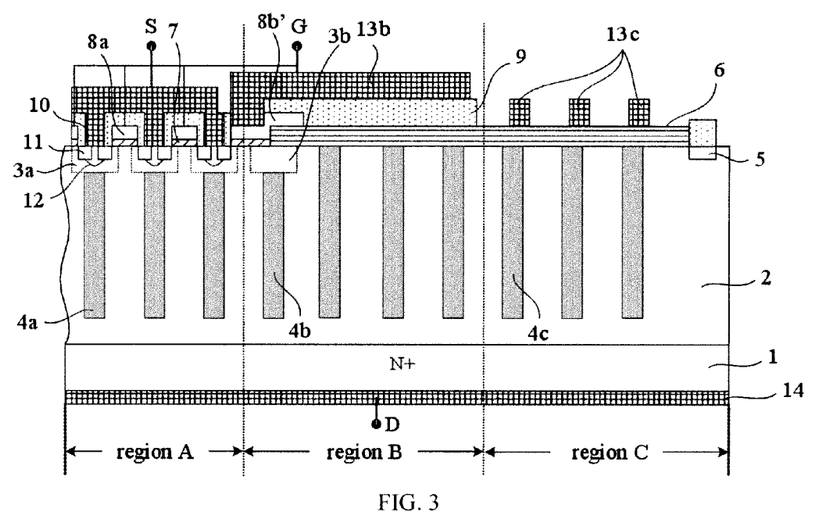
FIG. 3 is a cross section view of a terminal structure for superjunction device according to a second embodiment of the present invention.

FIG. 3 is a cross section view of a terminal structure for superjunction device according to a second embodiment of the present invention, which is an improved structure based on the superjunction device as shown in FIG. 2. The difference between the second embodiment and the first embodiment is that the polysilicon gate 8b' of region B has a stepped shape, that is to say, the polysilicon gate 8b' simultaneously covers the gate oxide layer 7 of region B and a part of the first dielectric film 6. The inside field plate 13b connects to the surface of the polysilicon gate 8b'. By using this step-shaped polysilicon gate, the electric field within the epitaxial layer 2 near the gate 8b' will vary smoothly, thus preventing sudden change in electric field and achieving better device performance.

Figure 4:
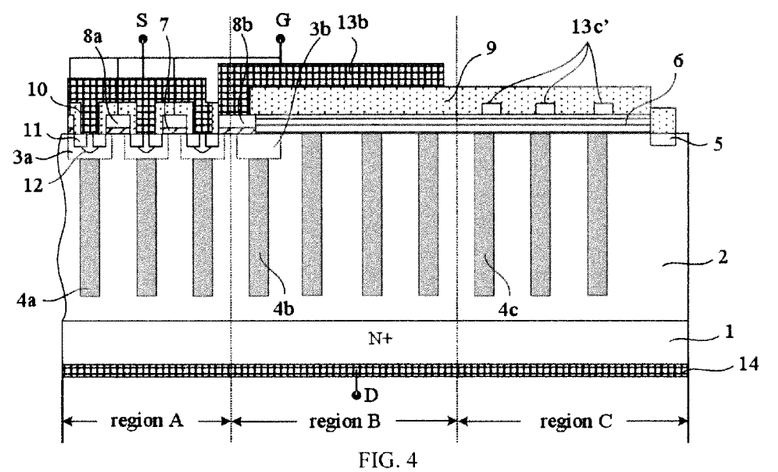
FIG. 4 is a cross section view of a terminal structure for superjunction device according to a third embodiment of the present invention.

FIG. 4 is a cross section view of a terminal structure for superjunction device according to a third embodiment of the present invention, which is an improved structure based on the superjunction device as shown in FIG. 2. The difference between the third embodiment and the first embodiment is that the outside field plates 13c' in region C are polysilicon field plates, which are formed on top of the first dielectric film 6 and are covered by the second dielectric film 9.

Figure 5:
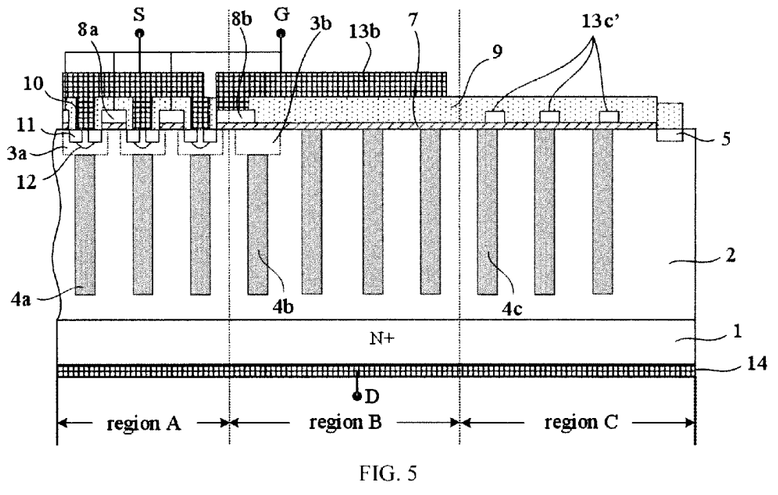
FIG. 5 is a cross section view of a terminal structure for superjunction device according to a fourth embodiment of the present invention.

FIG. 5 is a cross section view of a terminal structure for superjunction device according to a fourth embodiment of the present invention, which is an improved structure based on the superjunction device as shown in FIG. 2. The difference between the fourth embodiment and the first embodiment is that the gate oxide layer 7 covers the surface of the epitaxial layer 2 in all the regions of A~C. The first dielectric film is not included in this structure, and all the outside field plates 13c' in region C are polysilicon field plates, which are isolated from the epitaxial layer 2 by the gate oxide layer 7, while the inside field plate 13b is isolated from the epitaxial layer 2 by the second dielectric film 9 and the gate oxide layer 7.

Figure 6:
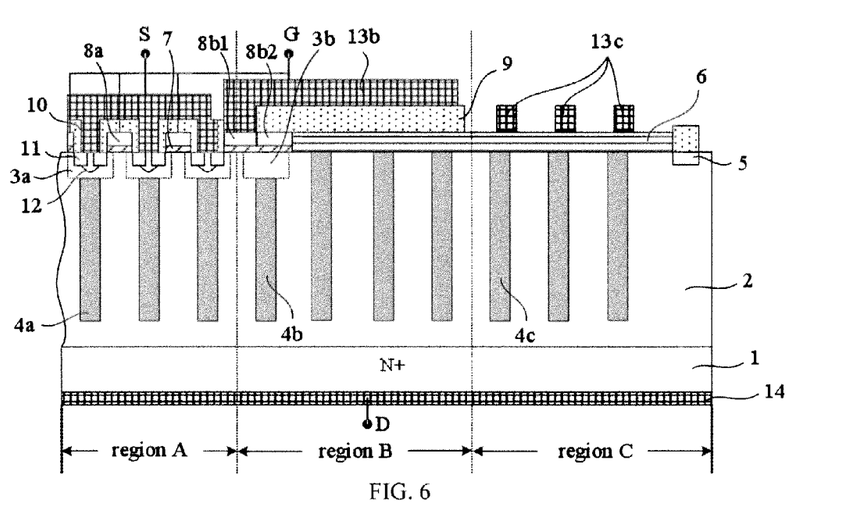
FIG. 6 is a cross section view of a terminal structure for superjunction device according to a fifth embodiment of the present invention.

FIG. 6 is a cross section view of a terminal structure for superjunction device according to a fifth embodiment of the present invention, which is an improved structure based on the superjunction device as shown in FIG. 2. The difference between the fifth embodiment and the first embodiment is that the polysilicon gate partly or totally located in region B is extended towards the border of the device to cover a first junction between the P type implantation ring 3b and the N type epitaxial layer 2 in region B. As shown in FIG. 6, the inside (left-side) part of the polysilicon gate 8b1 is used as a gate, while the outside (right-side) part of the polysilicon gate 8b2 is functioned as a field plate. This outside part of polysilicon gate 8b2 and the inside metal field plate 13b jointly form the field plate in region B to improve the capacity of voltage withstanding and increase the reliability of the device.

Figure 7:
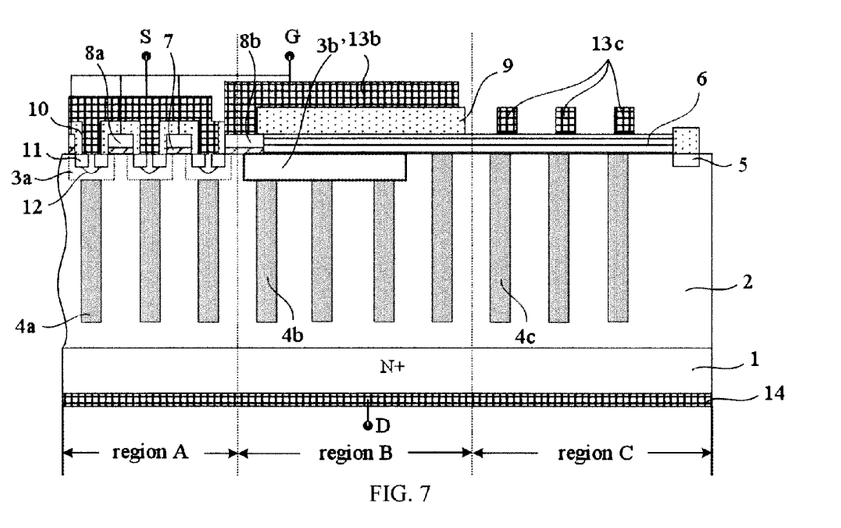
FIG. 7 is a cross section view of a terminal structure for superjunction device according to a sixth embodiment of the present invention.

FIG. 7 is a cross section view of a terminal structure for superjunction device according to a sixth embodiment of the present invention, which is an improved structure based on the superjunction device as shown in FIG. 2. The difference between the sixth embodiment and the first embodiment is that the P type implantation ring 3b' in region B is laterally extended to cover several alternating P type and N type thin layers, i.e. the P type trench rings 4b and the N type epitaxial layers 2 between the trench rings 4b. By using this improved structure, the electric field at the surface of the P type implantation ring 3b' will be reduced, and thereby improving the capacity of voltage withstanding and increase the reliability of the device.

Figure 8:
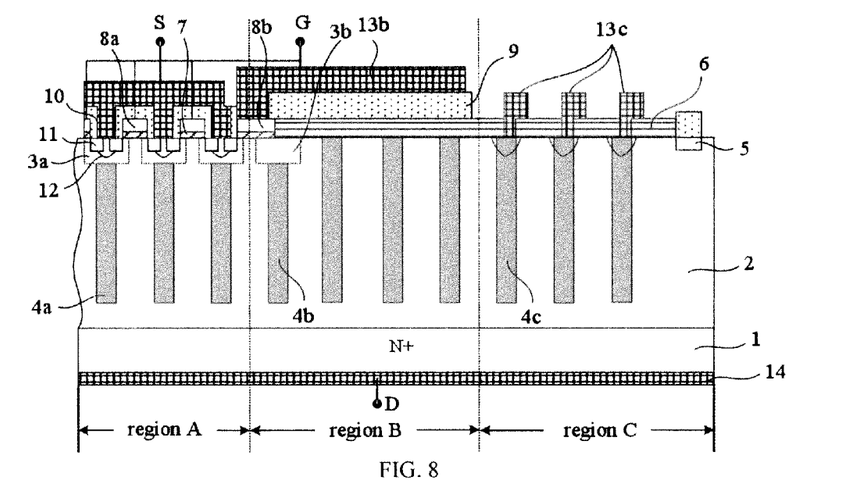
FIG. 8 is a cross section view of a terminal structure for superjunction device according to a seventh embodiment of the present invention.

FIG. 8 is a cross section view of a terminal structure for superjunction device according to a seventh embodiment of the present invention, which is an improved structure based on the superjunction device as shown in FIG. 2. The difference between the seventh embodiment and the first embodiment is that the outside field plates 13c in region C are connected to the P type silicon filled in the trench rings 4c via contacts, as a result, the electric potential of the outside field plates 13c is the same with the electric potential at the surface of the P type silicon filled in the trench rings 4c, thus improving the effect of the outside field plates and also improving the device performance.

Figure 9:
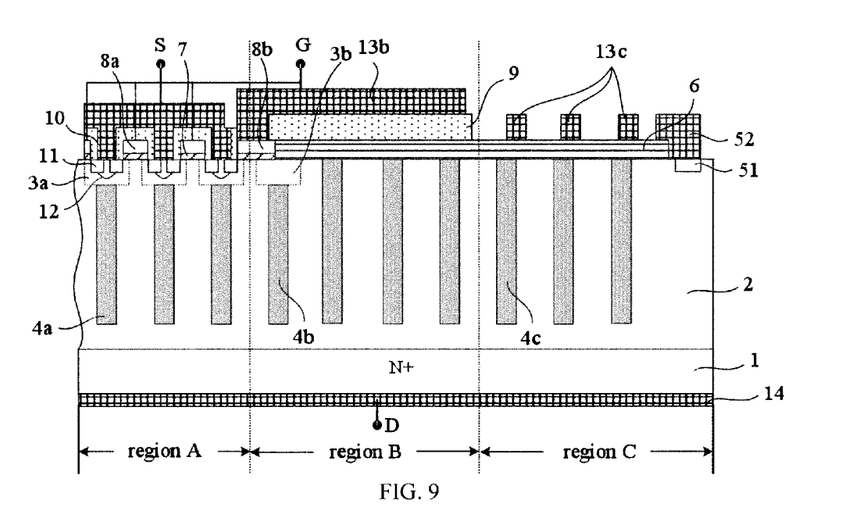
FIG. 9 is a cross section view of a terminal structure for superjunction device according to an eighth embodiment of the present invention.

FIG. 9 is a cross section view of a terminal structure for superjunction device according to an eighth embodiment of the present invention, which is an improved structure based on the superjunction device as shown in FIG. 2. The difference between the eighth embodiment and the first embodiment is that the channel cut-off ring is constituted by an N+ implantation ring 51 and a metal ring 52 formed on top of the implantation ring 51 to improve the reliability of the device.

Figure 10:
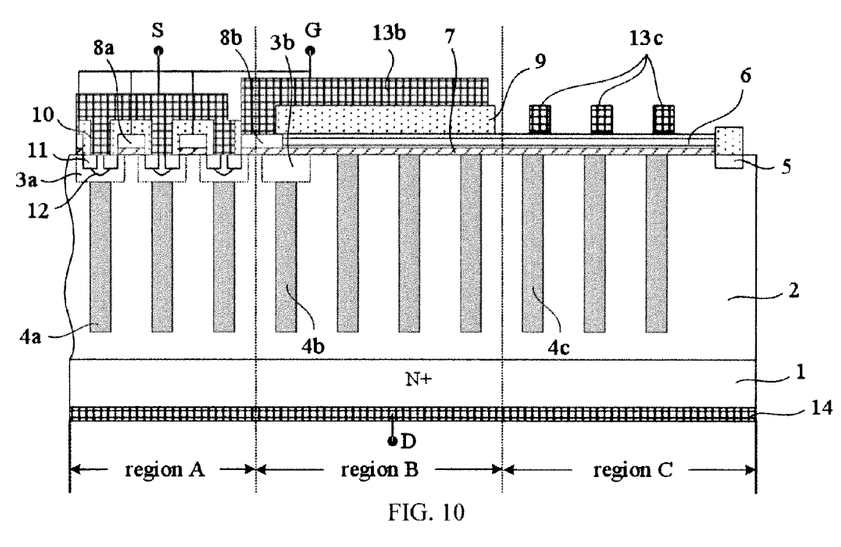
FIG. 10 is a cross section view of a terminal structure for superjunction device according to a ninth embodiment of the present invention.

FIG. 10 is a cross section view of a terminal structure for superjunction device according to a ninth embodiment of the present invention, which is an improved structure based on the superjunction device as shown in FIG. 2. The difference between the ninth embodiment and the first embodiment is that the gate oxide layer 7 is formed on the surface of the N type epitaxial layer 2 to cover all the regions of A~C, and the first dielectric layer 6 is formed on the gate oxide layer 7. Therefore, the outside field plates 13c in region C are isolated from the epitaxial layer 2 by the gate oxide layer 7 and the first dielectric layer 6, while the inside field plate 13b is isolated from the epitaxial layer 2 by the gate oxide layer 7, the first dielectric film 6 and the second dielectric film 9.

To sum up, the inter layer dielectric film between the epitaxial layer 2 and the inside field plate 13b may be composed of the first and second dielectric films 6 and 9, or the gate oxide layer 7 and the second dielectric film 9, or the gate oxide layer 7, the first dielectric film 6 and the second dielectric film 9. The inter layer dielectric film between the epitaxial layer 2 and the outside field plates 13c may be composed of the first dielectric films 6, or the gate oxide layer 7, or the gate oxide layer 7 and the first dielectric film 6. The thicknesses of the gate oxide layer 7 and the dielectric films 6 and 9 are in a range of 500~1500 angstroms and 5000~10000 angstroms respectively. Therefore, the inter layer dielectric film between the epitaxial layer 2 and the inside field plate 13b has a thickness of 5500~21500 angstroms, while the inter layer dielectric film between the epitaxial layer 2 and the outside field plates 13c has a thickness of 500~11500 angstroms. These thicknesses can be adjusted according to the requirement of voltage withstanding.

Furthermore, in the above-mentioned nine embodiments, the inside field plate 13b may not be connected to the gate electrode G. In such a case, the inside field plate 13b is connected to the P wells 3a or is floating.

Figure 11:
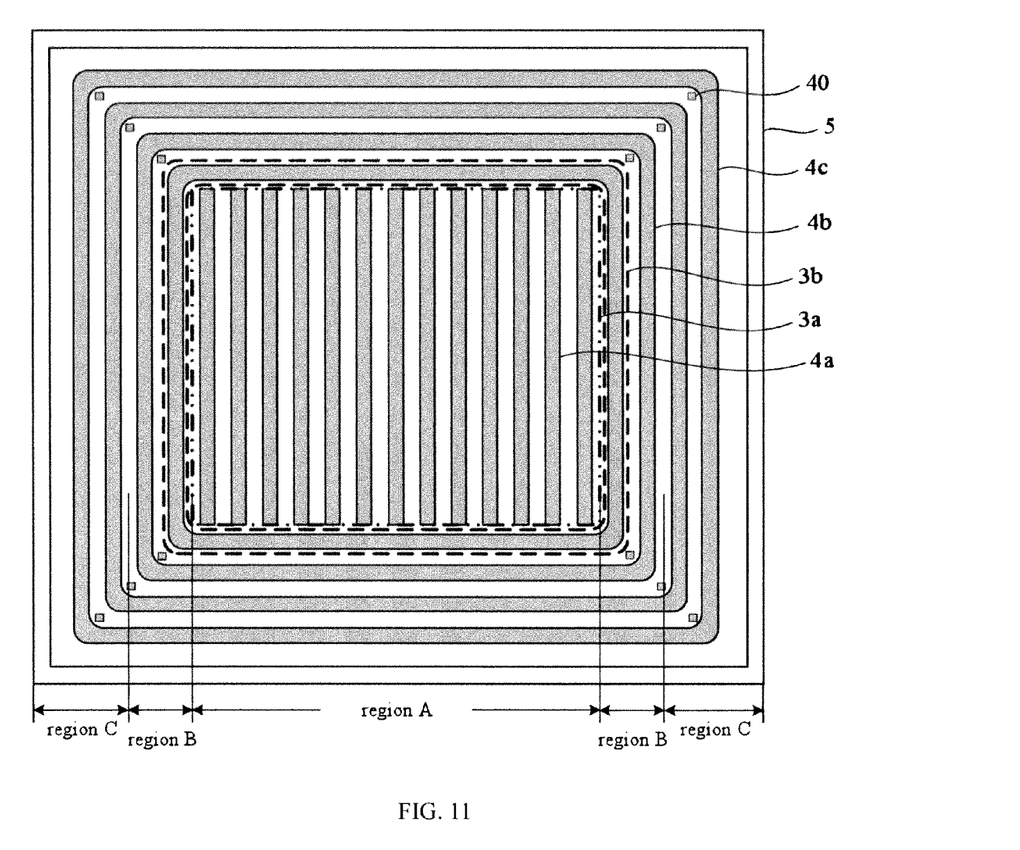
FIG. 11 is a top view of a terminal structure for superjunction device according to a tenth embodiment of the present invention.

FIG. 11 is a top view of a terminal structure for superjunction device according to a tenth embodiment of the present invention, which is an improved structure based on the superjunction device as shown in FIG. 1. The difference is that the trench rings 4b, 4c of the terminal structure have a shape of rectangular with curved corners instead of rectangular corners.

Figure 12:
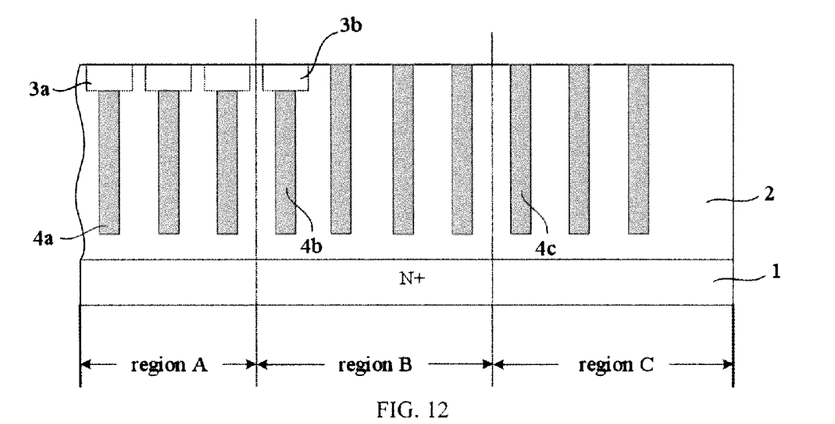
FIGS. 12~14 are cross section views of a manufacturing method according to one embodiment of the present invention.
Figure 13:
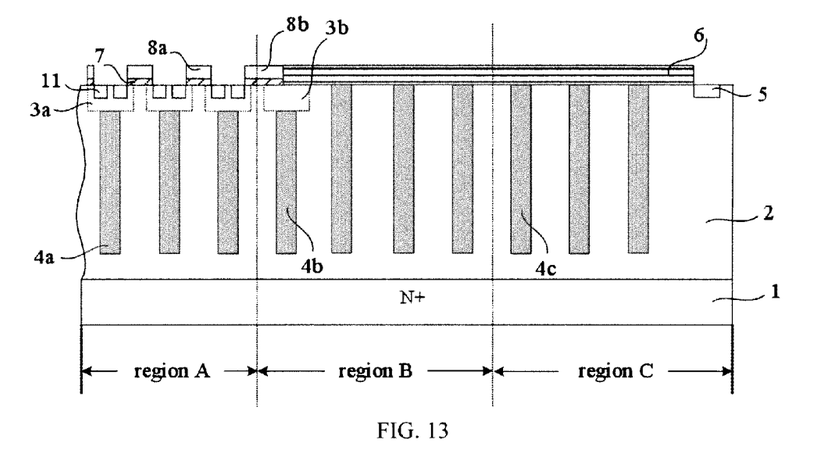
Figure 14:
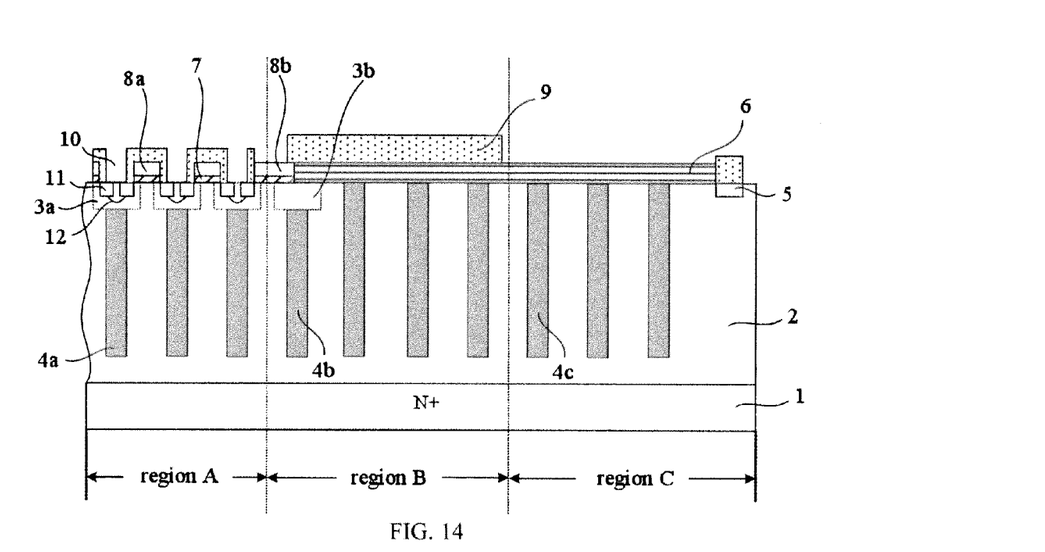

FIG. 12~FIG. 14 are cross section views of a method for manufacturing a terminal structure as shown in FIG. 2 according to an eleventh embodiment of the present invention, which comprises the following steps:

Step 1: as shown in FIG. 12, form an N type epitaxial layer 2 on an N+ type substrate 1 with high impurity concentration, and form P wells 3a and at least one P type implantation ring 3b in the N type epitaxial layer 2 by lithography and ion implantation.

Step 2: as shown in FIG. 12, form trenches in the N type epitaxial layer 2 by lithography and etch, wherein the trenches include trench stripes 4a in the active area and trench rings 4b, 4c in the terminal area. The trenches may pass through the N type epitaxial layer 2 and connect with the substrate 1 or may stop in the N type epitaxial layer 2 and isolate from the substrate 1.

Step 3: as shown in FIG. 12, fill the trenches with P type silicon and remove the silicon on top of the N type epitaxial layer 2 to form P type trench stripes 4a and P type trench rings 4b, 4c.

What should be mentioned is that, although it seems in FIG. 12 that the trench stripes 4a and the first trench ring 4b closest to region A are formed under the P wells 3a and the P type implantation ring 3b respectively, in a real structure, the top of the trenches 4a, 4b is at the same level with the surface of the N type epitaxial layer 2, in other words, the trench stripes 4a are surrounded by the P wells 3, while the first trench ring 4b closest to region A is surrounded by the P type implantation ring 3b.

Step 4: as shown in FIG. 13, form a first dielectric film 6 on top of the N type epitaxial layer 2 in the terminal area (in regions B and C).

Step 5: as shown in FIG. 13, deposit a gate oxide layer 7 and a polysilicon layer on the N type epitaxial layer 2 in sequence, and form polysilicon gates 8a, 8b by lithography and etch.

Step 6: as shown in FIG. 13, form N+ source regions 11 and a channel cut-off ring 5 by lithography and N+ ion implantation, wherein the N+ source regions 11 are formed at both sides of the polysilicon gates 8a in the P wells 3a, while the channel cut-off ring 5 is formed at the outside border of region C (border of the device).

Step 7: as shown in FIG. 14, deposit a second dielectric film 9.

Step 8: as shown in FIG. 14, form contact holes 10 in the source areas, and remove a part of the second dielectric film 9 in region C. Simultaneously, remove a part of or all of the second dielectric film 9 on top of the polysilicon gate 8b to partly or totally expose the surface of the polysilicon gate 8b, thereby forming a gate contact on the polysilicon gate 8b for connecting to the inside field plate 13b to be formed in subsequent process.

Step 9: as shown in FIG. 14, form ohmic contact regions 12 in the P wells 3a by P+ implantation through the contact holes 10.

Step 10: as shown in FIG. 2, deposit metal and form a source electrode S, a gate electrode D and metal field plates 13b, 13c by lithography and etch.

Step 11: as shown in FIG. 2, perform backside grinding to reduce the thickness of the substrate 1.

Step 12: as shown in FIG. 2, deposit metal 14 on the backside of the substrate 1 to form a drain electrode D.

In a twelfth embodiment, the trenches 4a, 4b and 4c may be formed prior to the formation of the P wells 3a and the P type implantation ring 3b. The manufacturing method is as follows:

Step 1: form an N type epitaxial layer 2 on an N+ type substrate 1 with high impurity concentration, and form trenches in the N type epitaxial layer 2 by lithography and etch, wherein the trenches include trench stripes 4a in the active area and trench rings 4b, 4c in the terminal area.

Step 2: fill the trenches with P type silicon and remove the silicon on top of the N type epitaxial layer 2 to form P type trench stripes 4a and P type trench rings 4b, 4c.

Step 3: form a first dielectric film 6 on top of the N type epitaxial layer 2 in the terminal area regions B and C).

Step 4: deposit a gate oxide layer 7 and a polysilicon layer on the N type epitaxial layer 2 in sequence, and form polysilicon gates 8a, 8b by lithography and etch.

Step 5: form P wells 3a and at least one P type implantation ring 3b in the N type epitaxial layer 2 by lithography and ion implantation.

Steps 6 to 12 are the same with the eleventh embodiment.

In a thirteenth embodiment, in order to manufacture a terminal structure as shown in FIG. 5, the manufacturing method comprises the following steps:

Step 1: form an N type epitaxial layer 2 on an N+ type substrate 1 with high impurity concentration, and form P wells 3a and at least one P type implantation ring 3b in the N type epitaxial layer 2 by lithography and ion implantation.

Step 2: form trenches in the N type epitaxial layer 2 by lithography and etch, wherein the trenches include trench stripes 4a in the active area and trench rings 4b, 4c in the terminal area.

Step 3: fill the trenches with P type silicon and remove the silicon on top of the N type epitaxial layer 2 to form P type trench stripes 4a and P type trench rings 4b, 4c.

Step 4: deposit a gate oxide layer 7 on the N type epitaxial layer 2, and form polysilicon gates 8a, 8b and outside field plates 13c' on the gate oxide layer 7.

Step 5: form N+ source regions 11 and a channel cut-off ring 5 by lithography and N+ ion implantation, wherein the N+ source regions 11 are formed at both sides of the polysilicon gates 8a in the P wells 3a, while the channel cut-off ring 5 is formed at the outside border of region C.

Step 6: deposit a second dielectric film 9.

Step 7: form contact holes 10 in the source areas, and remove a part of the second dielectric film 9 in region C. Simultaneously, remove a part of or all of the second dielectric film 9 on top of the polysilicon gate 8b to partly or totally expose the surface of the polysilicon gate 8b, thereby forming a gate contact on the polysilicon gate 8b for connecting to the inside field plate 13b to be formed in subsequent process.

Step 8: form ohmic contact regions 12 in the P wells 3a by P+ implantation through the contact holes 10.

Step 9: deposit metal and form a source electrode S, a gate electrode D and an inside field plate 13b by lithography and etch.

Step 10: perform backside grinding to reduce the thickness of the substrate 1.

Step 11: deposit metal 14 on the backside of the substrate 1 to form a drain electrode D.

In a fourteenth embodiment, the trenches 4a, 4b and 4c may be formed prior to the formation of the P wells 3a and the P type implantation ring 3b. The manufacturing method is as follows:

Step 1: form an N type epitaxial layer 2 on an N+ type substrate 1 with high impurity concentration, and form trenches in the N type epitaxial layer 2 by lithography and etch, wherein the trenches include trench stripes 4a in the active area and trench rings 4b, 4c in the terminal area.

Step 2: fill the trenches with P type silicon and remove the silicon on top of the N type epitaxial layer 2 to form P type trench stripes 4a and P type trench rings 4b, 4c.

Step 3: deposit a gate oxide layer 7 on the N type epitaxial layer 2, and form polysilicon gates 8a, 8b and outside field plates 13c' on the gate oxide layer 7.

Step 4: form P wells 3a and at least one P type implantation ring 3b in the N type epitaxial layer 2 by lithography and ion implantation.

Step 5: form N+ source regions 11 and a channel cut-off ring 5 by lithography and N+ ion implantation, wherein the N+ source regions 11 are formed at both sides of the polysilicon gates 8a in the P wells 3a, while the channel cut-off ring 5 is formed at the outside border of region C.

Step 6: deposit a second dielectric film 9.

Steps 7 to 11 are the same with the thirteenth embodiment.

By making changes to the above mentioned manufacturing methods, those skilled in the art may easily fabricate the corresponding terminal structures as shown in FIGS. 3~4 and 6~10.

Figure 15:
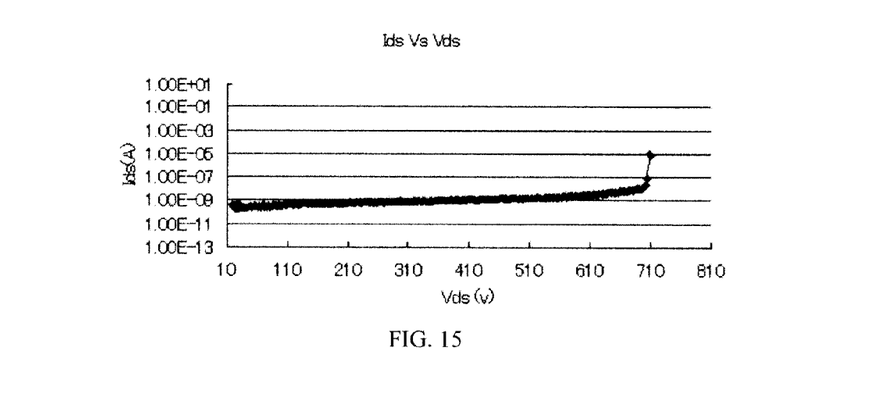
FIG. 15 is a schematic view of an output characteristic curve (Ids vs Vds) of a superjunction device according to one embodiment of the present invention, wherein a gate electrode of the superjunction device is grounded with a source electrode.

As shown in FIG. 15, which is an Ids vs Vds output characteristic curve of a superjunction device manufactured by the above-mentioned method, a breakdown voltage of 700V can be achieved by using an N type epitaxial layer of 45 µm thickness.

In FIG. 1, the additional trenches 40 can be designed to optimize the electric charge balance at the corner areas. If the width of a trench ring 4b or 4c is a, and the distance between two neighboring trench rings is also a, then the additional trenches 40 can be designed as squares with a length of 0.3 a~0.5 a.

Although the present invention has been described in considerable detail with reference to certain preferred embodiments thereof, the disclosure is not for ng the scope of the present invention. Persons having ordinary skill in the art may make various modifications and changes without departing from the scope and spirit of the present invention. Therefore, the scope of the appended claims should not be limited to the description of the preferred embodiments described above.

What is claimed is:

1. A terminal structure for superjunction device, the superjunction device comprising a first type substrate and a first type epitaxial layer formed on the first type substrate, a central part of the superjunction device being an active area, a plurality of trench stripes being formed in the first type epitaxial layer in the active area, a second type impurity being filled into the trench stripes to form second type trench stripes, the superjunction device further comprising a plurality of second type wells, formed beneath a surface of the first type epitaxial layer, each second type well surrounding a second type trench stripe; source regions, formed in each of the second type wells; a gate oxide layer, a gate electrode and a source electrode, respectively formed above the first type epitaxial layer; and a drain electrode, formed at a backside of the first type substrate; wherein from a top view, the terminal structure is arranged around the periphery of the active area, and the terminal structure comprises from inside out at least one second type implantation ring, a plurality of trench rings and a channel cut-off ring;

from a cross section view, the second type implantation ring is formed beneath the surface of the first type epitaxial layer and covers at least one trench ring, each of the trench rings being formed in the first type epitaxial layer and being filled with a second type impurity, the channel cut-off ring being formed beneath the surface of the first type epitaxial layer near a border of the superjunction device;

the terminal structure further comprises an inter layer dielectric film, formed above the first type epitaxial layer, covering a part of the second type implantation ring and the plurality of trench rings; and a plurality of field plates, including: an inside field plate, formed on the inter layer dielectric film; and at least one outside field plate, formed on or inside the inter layer dielectric film; the plurality of field plates being isolated from one another;

wherein, the first type is N type when the second type is P type; the first type is P type when the second type is N type.

2. The terminal structure according to claim, wherein:
the width of the trench rings is small than or equal with the width of the trench stripes, and the spacing between adjacent trench rings is smaller than or equal with the spacing between adjacent trench stripes.

3. The terminal structure according to claim 1, wherein:
the trench rings have a shape of rectangular or a shape of rectangular with curved corners.

4. The terminal structure according to claim 3, wherein:
additional trenches filled with a second type impurity are formed at the corners of each trench ring.

5. The terminal structure according to claim 4, wherein:
the additional trenches are connected to the corners of a trench ring or being isolated from the trench ring.

6. The terminal structure according to claim 1, wherein:
the second type implantation ring is connected to the second type wells.

7. The terminal structure according to claim 1, wherein:
the inside field plate is made of metal; the at least one outside field plate is made of metal when formed on the inter layer dielectric film, or is made of polysilicon when formed inside the inter layer dielectric film.

8. The terminal structure according to claim 1, wherein:
the inside field plate is interconnected to the gate electrode.

9. The terminal structure according to claim 1, wherein:
the inside field plate is connected to the second type wells or is floating.

10. The terminal structure according to claim 1, wherein:
a part of the inter layer dielectric film below the inside field plate is thicker than a part of the inter layer dielectric film below the at least one outside field plate.

11. The terminal structure according to claim 10, wherein:
the part of the inter layer dielectric film below the inside field plate has a thickness of 5500-21500 angstroms, and the part of the inter layer dielectric film below the at least one outside field plate has a thickness of 500-11500 angstroms.

12. The terminal structure according to claim 1, wherein:
the part of the inter layer dielectric film below the inside field plate is formed from bottom up by a first dielectric film and a second dielectric film, or by the gate oxide layer and a second dielectric film, or by the gate oxide layer, a first dielectric film and a second dielectric film; while the part of the inter layer dielectric film below the at least one outside field plate is formed by a first dielectric film, or by the gate oxide layer, or formed from bottom up by the gate oxide layer and a first dielectric film.

13. The terminal structure according to claim 1, wherein:
the at least one outside field plate is floating or connected to the trench rings.

14. The terminal structure according to claim 1, wherein:
the channel cut-off ring is a first type implantation ring or a first type plantation ring combined with a metal ring formed thereon.

15. A method of manufacturing a terminal structure for superjunction device according to claim 1, comprising the following steps:

forming a first type epitaxial layer on a first type substrate;

forming a plurality of second type wells and at least one second type implantation ring in the first type epitaxial layer;

forming trench stripes in an active area and forming trench rings in a terminal area;

filling the trench stripes and the trench rings with a second type impurity;

forming a gate oxide layer on the first type epitaxial layer and form polysilicon gates on the gate oxide layer in the active area;

forming first type source regions and a channel cut-off ring by first type ion implantation;

forming a plurality of field plates and isolating the plurality of field plates from the first type epitaxial layer by an inter layer dielectric film;

wherein, the first type is N type when the second type is P type; the first type is P type when the second type is N type.

16. The method of manufacturing a terminal structure for superjunction device according to claim 15, wherein:

the step of forming a plurality of second type wells and at least one second type implantation ring in the first type epitaxial layer can be performed after the step of forming polysilicon gates on the gate oxide layer in the active area.

17. The method of manufacturing a terminal structure for superjunction device according to claim 15, wherein the inter layer dielectric film is composed of a first dielectric film and a second dielectric film, and the step of forming a plurality of field plates and isolating the plurality of field plates from the first type epitaxial layer by an inter layer dielectric film further comprises:

depositing the first dielectric film on the first type epitaxial layer and patterning the first dielectric film before the step of forming a gate oxide layer on the first type epitaxial layer;

depositing and patterning the second dielectric film after the step of forming first type source regions and a channel cut-off ring;

depositing metal and forming the plurality of field plates by patterning the metal.

18. The method of manufacturing a terminal structure for superjunction device according to claim 15, wherein the inter layer dielectric film is composed of a first dielectric film and a second dielectric film, and the step of forming a plurality of field plates and isolating the plurality of field plates from the first type epitaxial layer by an inter layer dielectric film further comprises:

depositing the first dielectric film on the first type epitaxial layer and patterning the first dielectric film before the step of forming a gate oxide layer on the first type epitaxial layer;

forming at least one outside field plate on the first dielectric film, wherein the at least one outside field plate is made of polysilicon and is formed simultaneously with the polysilicon gates during the step of forming polysilicon gates on the gate oxide layer in the active area;

depositing and patterning the second dielectric film;

depositing metal and forming an inside field plate on the second dielectric film.

19. The method of manufacturing a terminal structure for superjunction device according to claim 15, wherein the inter layer dielectric film is composed of the gate oxide layer and a second dielectric film, and the step of forming a plurality of field plates and isolating the plurality of field plates from the first type epitaxial layer by an inter layer dielectric film further comprises:

forming at least one outside field plate on the gate oxide layer, wherein the at least one outside field plate is made of polysilicon and is formed simultaneously with the polysilicon gates during the step of forming polysilicon gates on the gate oxide layer in the active area;

depositing and patterning the second dielectric film;

depositing metal and forming an inside field plate on the second dielectric film.

20. The method of manufacturing a terminal structure for superjunction device according to claim 15, wherein the inter layer dielectric film is composed of the gate oxide layer, a first dielectric film and a second dielectric film, and the step of forming a plurality of field plates and isolating the plurality of field plates from the first type epitaxial layer by an inter layer dielectric film further comprises:

depositing the first dielectric film on the gate oxide layer and patterning the first dielectric film;

depositing and patterning the second dielectric film;

depositing metal and forming the plurality of field plates by patterning the metal.

21. The method of manufacturing a terminal structure for superjunction device according to claim 15, further comprising:

forming contact holes connecting to the first type source regions;

forming ohmic contacts in the second type wells by a second type implantation through the contact holes;

forming a source electrode and a gate electrode;

reducing the thickness of the first type substrate by backside grinding;

depositing metal on a backside of the first type substrate and forming a drain electrode.

* * * * *

UNITED STATES PATENT AND TRADEMARK OFFICE
CERTIFICATE OF CORRECTION

PATENT NO. : 8,546,882 B2  
APPLICATION NO. : 13/076289  
DATED : October 1, 2013  
INVENTOR(S) : Shengan Xiao, Fei Wang and Yanping Liu Page 1 of 1

It is certified that error appears in the above-identified patent and that said Letters Patent is hereby corrected as shown below:

In the Claims

Column 12, Claim 2, line 1, delete "claim" and insert --claim 1--.

Column 12, Claim 14, line 55, delete "plantation" and insert --implantation--.

Signed and Sealed this  
First Day of July, 2014

Michelle K. Lee  
*Deputy Director of the United States Patent and Trademark Office*